United States Patent
Yu et al.

(10) Patent No.: US 8,589,749 B1
(45) Date of Patent: Nov. 19, 2013

(54) MEMORY CONTENT PROTECTION DURING SCAN DUMPS AND MEMORY DUMPS

(75) Inventors: Jianlin Yu, Cupertino, CA (US); Santiago Fernandez-Gomez, Sunnyvale, CA (US); Herb Lopez-Aguado, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 248 days.

(21) Appl. No.: 13/149,194

(22) Filed: May 31, 2011

(51) Int. Cl.
  *G01R 31/3177* (2006.01)
  *G01R 31/327* (2006.01)

(52) U.S. Cl.
  USPC .......................................... 714/729; 714/733

(58) Field of Classification Search
  None
  See application file for complete search history.

(56) References Cited

U.S. PATENT DOCUMENTS

| | | | |
|---|---|---|---|
| 4,590,552 A | 5/1986 | Guttag | |
| 6,018,815 A | 1/2000 | Baeg | |
| 6,314,539 B1 | 11/2001 | Jacobson | |
| 6,380,724 B1 | 4/2002 | Mahurin | |
| 6,408,414 B1 | 6/2002 | Hatada | |
| 6,587,981 B1 | 7/2003 | Muradali et al. | |
| 6,615,380 B1 | 9/2003 | Kapur | |
| 6,711,708 B1 | 3/2004 | Shimomura | |
| 6,745,356 B1 | 6/2004 | Wong | |
| 6,757,856 B2 | 6/2004 | Bassett | |
| 6,766,501 B1 | 7/2004 | Duggirala | |
| 7,069,486 B2 | 6/2006 | Nagamine | |
| 7,340,658 B2 | 3/2008 | Seuring | |
| 7,487,367 B2 | 2/2009 | Belnet | |
| 7,533,315 B2 | 5/2009 | Han | |
| 2004/0088659 A1 | 5/2004 | Mori | |
| 2004/0098643 A1 | 5/2004 | Schulz | |
| 2005/0198542 A1* | 9/2005 | Freker et al. | 713/320 |

FOREIGN PATENT DOCUMENTS

JP      2002122637      4/2002

* cited by examiner

*Primary Examiner* — Ajay Bhatia
*Assistant Examiner* — Dipakkumar Gandhi
(74) *Attorney, Agent, or Firm* — Lawrence J. Merkel; Erik A. Heter; Meyertons, Hood, Kivlin, Kowert & Goetzel, P.C.

(57) ABSTRACT

A method and apparatus for preventing the overwriting of memory contents during certain scan operations is disclosed. An integrated circuit (IC) may include a memory and a scan chain having a number of serially coupled scan elements. A number of the scan elements may be coupled to circuitry for inputting signals to or receiving signals output from the memory. An inhibit circuit may also be coupled to the circuitry for inputting signals to the memory. During scan shifting operations commensurate with a scan dump mode or a memory dump mode, the inhibit circuit may de-assert one or more control signals that otherwise enable access to the memory in order to prevent shifted data from overwriting the contents stored in the memory. The apparatus may also include a bypass unit coupled to a memory read port, which can be activated to prevent unauthorized access to protected data stored in the memory.

23 Claims, 6 Drawing Sheets

MEMORY CONTENT PROTECTION DURING SCAN DUMPS AND MEMORY DUMPS

BACKGROUND

1. Field of the Invention

This invention relates to electronic circuits, and more particularly, to the accessing of memory contents through scan circuitry.

2. Description of the Related Art

Circuitry to support scan testing may provide internal access to an integrated circuit (IC). Scan circuitry may be implemented by forming chains of scannable elements. Data may be serially shifted through the scannable elements of the scan chain.

This may allow for the input of test stimulus data, as well as the capture and shifting out of test result data. Using available scan circuitry, manufacturing tests may be conducted on ICs prior to their shipment to a customer in order to verify the circuitry therein. Scan circuitry may also support hardware debugging during the development phase of an IC, providing information for future revisions thereof.

Since scan chains may provide internal access to an IC, they may have use that extends beyond manufacturing test. One of these uses is support for the debugging of software that is being designed to operate on the IC. Software in a development phase may require extensive debugging in order to remove errors and arrive at a finished product. Some of the errors in the software may be related to the manner in which it interacts with the circuitry of a chip. Accordingly, when an error is encountered during the debugging of software executing on the IC, scan circuitry may be used to capture internal data that can be used to analyze the problem. In some cases, scan circuitry may support a scan dump, which may enable the capture of an internal state of the chip. Scan circuitry may also support a memory dump, which can enable the capture of contents of one or more memories (e.g., register files, random storage memories, caches, etc.) in the IC. Accordingly, scan dumps and memory dumps may provide a useful tool for analysis of software bugs that occur during the development process.

SUMMARY

A method and apparatus for preventing memory contents from being overwritten during scan operations is disclosed. In one embodiment, an integrated circuit includes at least one chain of serially coupled scan elements. A first subset of scan elements is coupled to an input path of the memory, while a second subset is coupled to an output path of the memory. An inhibit circuit is also coupled to the input path of the memory. The inhibit circuit may be activated to prevent data stored in the memory from being overwritten during scan shifting operations.

In one embodiment, a method includes shifting data through the scan elements of a scan chain, wherein some elements of the scan chain are coupled to a memory. The method further includes preventing the shift operations from causing the contents of the memory to be overwritten. Writes to the memory may be disabled by causing a de-assertion of at least one of a write enable signal and memory enable signal during scan shifting operations.

A bypass circuit may also be implemented. As noted above, a second subset of scan elements is coupled to a data output path. During some scan operations, data from the memory may be captured by the scan elements of the second subset. However, for certain selected addresses (e.g., addresses designated for storing secure data), a bypass circuit may enable a bypass path around the second subset of scan elements. More particularly, the invoking the bypass path may cause the scan elements to be effectively excluded from the scan chain. By effectively excluding the second subset of scan elements by invoking the bypass path, secure data stored in the memory may be made inaccessible.

BRIEF DESCRIPTION OF THE DRAWINGS

The following detailed description makes reference to the accompanying drawings, which are now briefly described.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Figure 1:
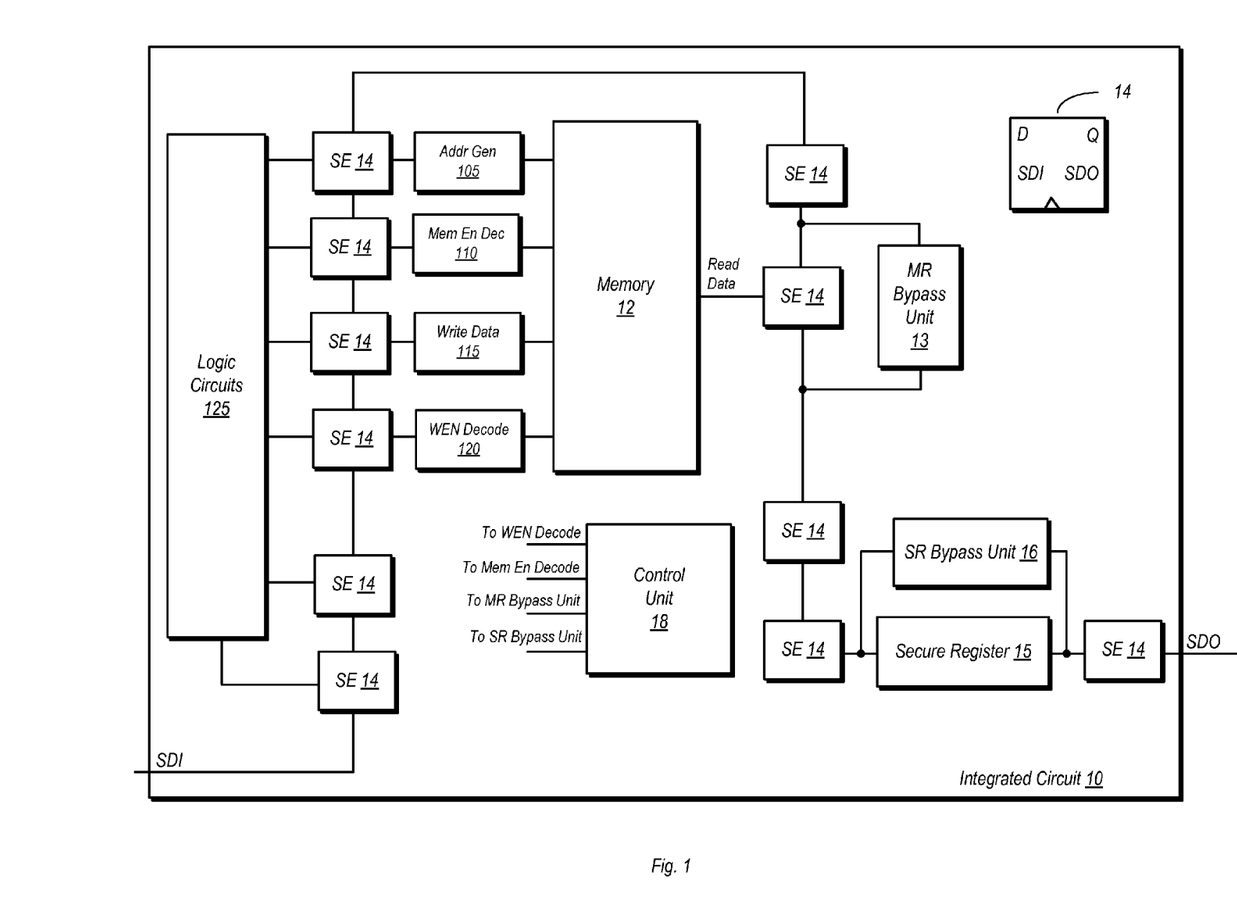
FIG. 1 is a block diagram of one embodiment of an integrated circuit having a scan chain and a memory.

Integrated Circuit with Scan Chain and Memory:

Turning now to FIG. 1, a block diagram of one embodiment of an integrated circuit having a scan chain and a memory. In the embodiment shown, integrated circuit (IC) 10 includes a scan chain having a number of serially coupled scan elements 14. The scan elements may be any one of a number of different scan element designs, including level sensitive scan design (LSSD) elements and multiplexer-D ('Mux-D') scan elements. Exemplary ones of the scan elements 14 are shown here as coupled to logic circuits 125 (in practice, most or all of the scan elements of a scan chain are coupled to other, non-scan related circuitry). The scan elements 14 may provide data to and/or receive data from logic circuits 125, which may be combinational circuits, sequential circuits, or a mixture of both. In some cases, mixed signal circuitry may also be included.

An exemplary embodiment of a scan element 14 is shown in the upper right corner of the drawing. In the embodiment shown, scan element 14 includes a data input ('D') and a data output ('Q'), both of which may be coupled to other, non-scan related circuitry (e.g., logic circuits 125). Each scan element 14 also includes a scan data input ('SDI') and a scan data output ('SDO'). In some embodiments, scan element 14 may include a single clock input, while in other embodiments, separate scan and system clock inputs. The clock input triangle shown in the exemplary embodiment may thus represent an input for a single or multiple clock signals, which may vary according to the specific design of scan element 14.

A serial scan chain may be formed by coupling the scan data output of one scan element 14 to a scan data input of a next scan element 14, and repeating this in a manner to form the scan chain. A first scan element 14 of the scan chain may have a scan data input coupled to a chip-level scan data input ('SDI' input on IC 10). A last scan element 14 of the scan chain may have a scan data output coupled to a chip-level scan data output ('SDO' output of IC 10). The number of scan elements in a particular scan chain may be any number desired and suitable for the particular implementation of IC 10. Furthermore, embodiments having multiple scan chains (some of which may be coupled together in various ways) are also possible and contemplated.

Scan shifting may be performed to input data into IC 10 or to extract data therefrom. For example, in a normal scan test mode, test stimulus data may be serially shifted into IC 10 through the chip-level scan data input, from one scan element 14 to the next (via respective element-level scan data inputs and scan data outputs) until all test stimulus data has been received at its intended scan element 14. The test stimulus data may then be applied to circuitry coupled to the data output ('Q') of each scan element 14, or from selected instances thereof. Test result data may be captured by respective data inputs ('D') of each scan element 14 or by selected instances thereof. Captured test result data may then be shifted through scan chain in the manner previously described, exiting IC 10 through the chip-level scan data output.

A chain of scan elements 14 may also be used for other purposes than normal scan testing. For example, chains of scan elements 14 (or other embodiments of a scan element) may be useful in extracting data when debugging software intended to execute on IC 10. One way that data may be extracted is through a scan dump. During a scan dump, data may be captured by each scan element 14 (or by selected instances) via their respective data inputs. The captured data may be indicative of a current state of logic circuitry having outputs coupled to the respective data inputs of scan elements 14. Afterwards, the captured data may be shifted from IC 10 in the manner described above and received externally for analysis.

IC 10 in the embodiment shown includes a memory 12, which may be used to store data during operation. Memory 12 in this embodiment includes four groups of input signals: address signals, data signal, a memory enable signal, and a write enable signal. The address signals may be received from address generator 105, while the data signals may be received from write data logic 115. It is noted that although only a single signal line is shown for each of the address and data paths into the memory, multiple signal lines may be present for each, and thus the single signal line is shown here for the sake of simplicity. Furthermore, multiple instances of scan elements 14 may be coupled to each of address generation logic 105 and write data logic 115, although only single instances of each are shown here for the sake of simplicity.

The memory enable decode logic 110 may provide decoding to determine when a memory enable signal is to be asserted. In the embodiment shown, the memory enable signal may be asserted when memory 12 is to be made accessible. The write enable decode logic ('WEN_decode') 120 may provide decoding to determine when a write enable signal is to be asserted to enable writes. Reads from memory 12 in this embodiment may be enabled when the memory enable signal is asserted. Writes to memory 12 in this embodiment may be enabled when memory enable and write enable signals are both asserted.

Memory 12 in the embodiment shown also includes an output data path. The output data path may be a path from which data read from memory 12 is conveyed. In this example, a single instance of a signal line from the output data path is shown for the sake of simplicity, although it is to be understood that multiple signal lines may be present to support reads from memory 12 at the desired width. In the embodiment shown, the exemplary signal line of the output data path is coupled to a scan element 14, and other instances of signal lines of the path may be similarly coupled to instances of scan elements. Each of these scan elements 14 may be further coupled to additional circuitry of IC 10.

In addition to the ability to perform a scan dump as described above, the scan chain may also provide the ability to extract data from memory 12 by performing a memory dump. To perform a memory dump, an address may be shifted into IC 10 through the scan chain and applied to memory 12 via scan elements 14 associated with the address inputs. Data may be read from the applied address and captured by those scan elements 14 coupled to the output data path. The data may then be shifted through the scan chain. In some cases, the amount of shifting of the data may correspond to the width of the data received or the width of the address. Another address may be applied and the process repeated. This may be repeated for a number of readable memory addresses in order to capture the contents of the memory at a given time.

Control unit 18 in the embodiment shown may provide certain control functions during the shifting of data through the scan chain during the various modes of operation. If the contents of memory 12 are to remain undisturbed during scan shifting, control unit 18 may provide a signal to write enable decoder 120 to hold a write enable signal de-asserted. Similarly, if both writes to and reads from memory 12 are to be prevented, control unit 18 may prevent the write enable signal and a memory enable signal from being asserted.

In addition to the above, control unit 18 may assert signals that may prevent the reading of certain addresses of memory 12. During operation (including debugging operations), memory 12 may store secure data in certain addresses of memory 12. The secure data may be such that it is secret and/or otherwise not intended for external address (e.g., a cryptography key). Accordingly, control unit 18 may assert and provide a control signal to memory read bypass unit 12 in order to invoke a bypass path. When the bypass path is invoked, a bypass path may be formed that passes around those scan elements 14 that are coupled to the output data path of memory 12. Control unit 18 may invoke the bypass path responsive to the inputting of an address that is associated with secure data or data otherwise not intended for access. Although not explicitly shown here, control unit 18 may be coupled to address generator 105 in such a manner that it may monitor address information to be provided to memory 12 during various operations (e.g., scan dump, memory dump) in order to prevent the reading of data in protected addresses. In some cases, control unit 18 may also inhibit reads from memory responsive to detecting a protected address by causing the memory enable signal to be de-asserted.

IC 10 in the embodiment shown also includes a secure register 15. Although not explicitly shown in FIG. 1, secure register 15 may include a number of serially coupled scan elements 14 through which data may be shifted during scan shifting operations in a normal scan test mode. A secure register bypass unit 16 is also coupled to divert the scan path during scan shifting in other modes (e.g., memory dump, scan dump) in order to prevent contents intended to remain secret from being accessed. The bypass path provided by secure register bypass unit 16 may be invoked responsive to receiving a control signal from control unit 18. The control signal invoking the bypass path may be asserted whenever IC 10 is operating in a dump mode, such as the scan dump mode described above.

Figure 2:
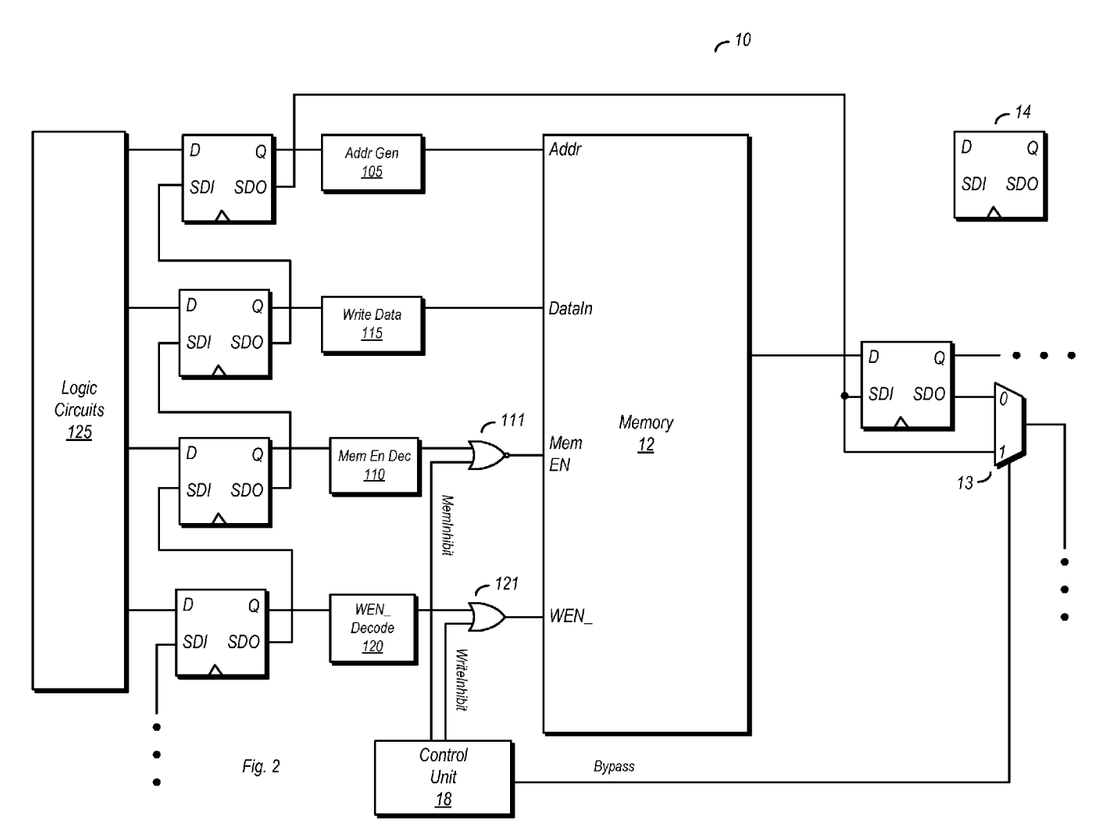
FIG. 2 is a block diagram illustrating the memory array having scan elements and other supporting circuitry coupled thereto for one embodiment of an IC.

FIG. 2 is a block diagram further illustrating the coupling of the scan chain to memory 12. In the embodiment shown, exemplary ones of scan elements 14 associated with memory 12 are shown. Scan elements 14 may be coupled to each of address generator 105, write data logic 115, memory enable decoder 110, and write enable decoder 120. In the case of address generator 105 and write data logic 115, multiple scan elements 14 may be coupled thereto, although single instances are shown in this example for the sake of simplicity. Address generator 105 may generate address information to be provided to address inputs ('Addr') of memory 12 for read and write operations. Write data logic 115 may provide a data path for data that is to be written into memory 12 via data inputs (DataIn). Memory enable decoder 110 may decode information received from its corresponding scan element 14 (and other inputs in some embodiments) to cause the assertion or de-assertion of a memory enable signal that may be received on a memory enable input ('MemEN'). Similarly, write enable decoder 120 may decode information received from its corresponding scan element 14 and other inputs that may be present in some embodiment to cause the assertion or de-assertion of a write enable signal that may be received on a write enable input ('WEN_').

In addition to the input logic described above, logic gates 111 and 121 may also be provided to assert and de-assert the memory enable and write enable signals, respectively. Taken together, control unit 18 along with logic gates 111 and 121 may effectively form a memory protection unit that can inhibit writes to memory 12, and thus protect the data stored therein (e.g., for a memory dump). The memory protection unit may also include bypass circuit 13, the function of which will be discussed in further detail below.

In this particular example, the memory enable signal is active high, while logic gate 111 is a NOR gate. Accordingly, control unit 18 may assert a memory inhibit signal ('MemInhibit') as a logic high to cause the output of logic gate 111 to fall low and thus prevent the assertion of the memory enable signal, irrespective of the logic value received from memory enable decoder 110. The write enable signal in this embodiment may be active low, while logic gate 121 is an OR gate. Thus, control unit 18 may assert a write inhibit signal ('WriteInhibit') as a logic high, thereby causing the output of logic gate 121 to go high, irrespective of the logic value received from write enable decoder 120.

During scan shifting operations, including those associated with a scan dump or a memory dump, the data outputs ('Q') of each of scan elements 14 may in some cases change values. Without circuitry to prevent the overwriting the contents of memory 12, the toggling of the data outputs of those scan elements 14 coupled to the control and data input paths of memory 12 could possibly cause the contents stored therein to be overwritten. By asserting the write inhibit signal, and thus holding the write enable signal in a de-asserted state, the overwriting of the contents stored in memory 12 may be prevented. Similarly, the assertion of the memory inhibit signal to cause the memory enable signal to be held as de-asserted may prevent unintended writes to memory 12. Preventing the assertion of the memory enable signal may also prevent data on the output data path from potentially disturbing data being shifted through correspondingly coupled scan elements 14.

As noted above, IC 10 includes a memory read bypass circuit 13, shown in this example as a multiplexer. When the bypass signal ('bypass') is not asserted, the '0' input of bypass circuit 13 is selected, and thus the scan path includes those scan elements 14 that are coupled to the output data path of memory 12. When the bypass signal is asserted, the '1' input of bypass circuit 13 is selected, and thus the scan elements 14 coupled to the output data path are effectively excluded from the scan path. Thus, when the bypass path is invoked, data is not shifted through the scan elements 14 coupled to the output data path of memory 12. The bypass path may be invoked for various reasons, including attempted reads of a protected/secure address of memory 12 during a memory dump operation in order to prevent unauthorized access to certain information.

Figure 3:
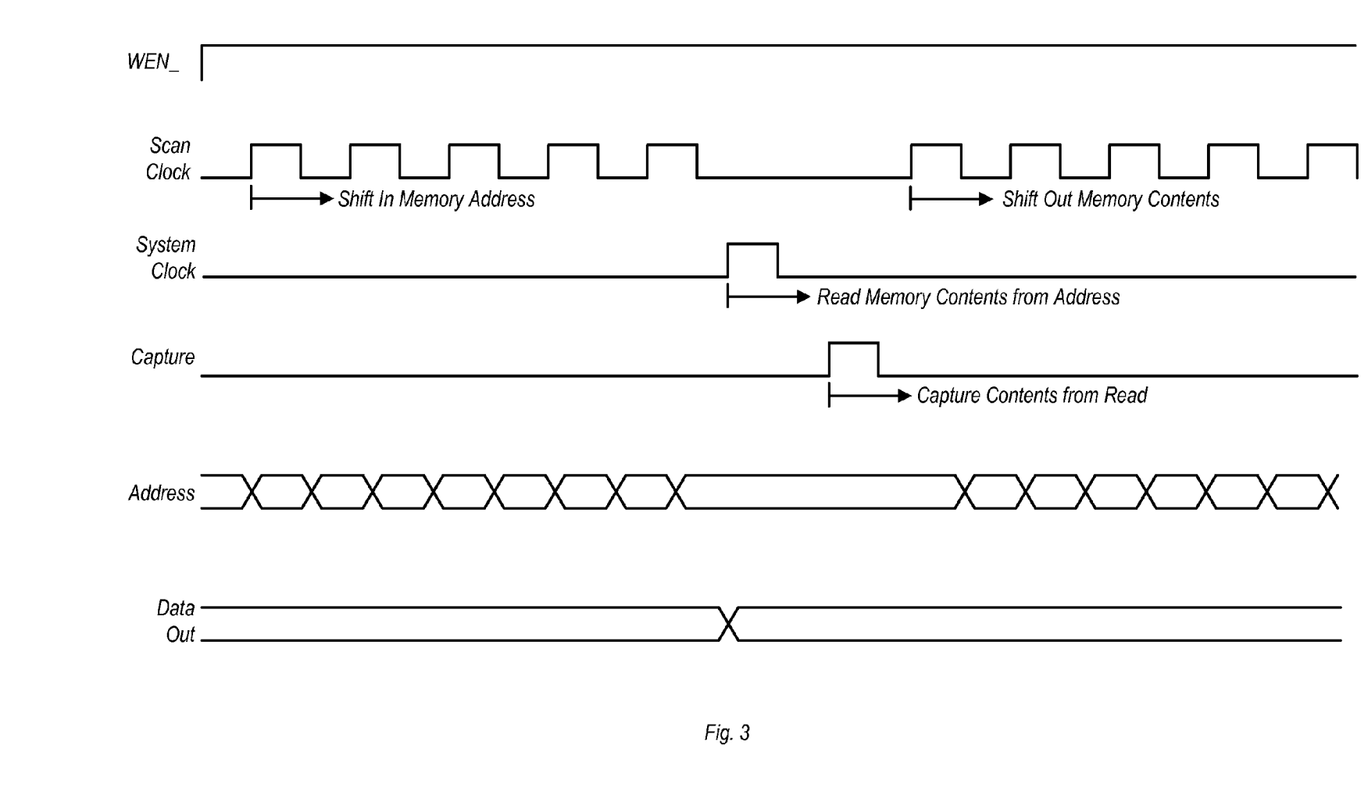
FIG. 3 is a timing diagram illustrating one embodiment of a memory dump operation.

Timing Diagram:

Turning now to FIG. 3, a timing diagram illustrating one embodiment of a memory dump operation is shown. The example shown assumes that each scan element is configured to receive a scan clock (or clocks) separate from a system clock that is used during normal operation.

In the example shown, the write enable signal, normally active low, may be driven high during the memory dump process. This may prevent inadvertent writes of data to the memory during the shifting in of address data and shifting out of captured memory data. As noted above with reference to the example of FIG. 2, the de-assertion of the write enable signal may result from control unit 18 asserting a write inhibit signal.

After the write enable signal has been forced into a de-asserted state, an address to be read may be shifted into the memory via the scan chain. In this example, a scan clock provided to each of the scan elements of the scan chain to cause the shifting operation to occur. The bits of the address may be shifted to scan elements that are coupled to circuitry that may provide an address input to the memory. Once the bits of the address have arrived at their respective destinations, the scan clock may be held low. With the address bits applied to the address input of the memory, a system clock may be pulsed to cause a read of the corresponding address. This may cause data to be output from the memory on its output data path. A capture signal may then be asserted to cause the scan elements coupled to the output data path of the memory to capture the data read from the selected address. It is noted that the capture signal may be a separate clock signal in some embodiments, but may also be the same as the system clock in other embodiments. The capture signal is shown here as a separate signal for the sake of illustration.

Following the capture of the data read from the selected address, shift operations may resume. The scan clock may begin cycling again, causing data to be shifted through the scan chain, from scan element to scan element. In addition, a new address may be shifted in at this time. Accordingly, the process illustrated here may be repeated for a number of memory addresses. In some cases, all non-protected addresses of the memory may be read, with their contents subsequently shifted out of the IC for subsequent analysis.

Figure 4:
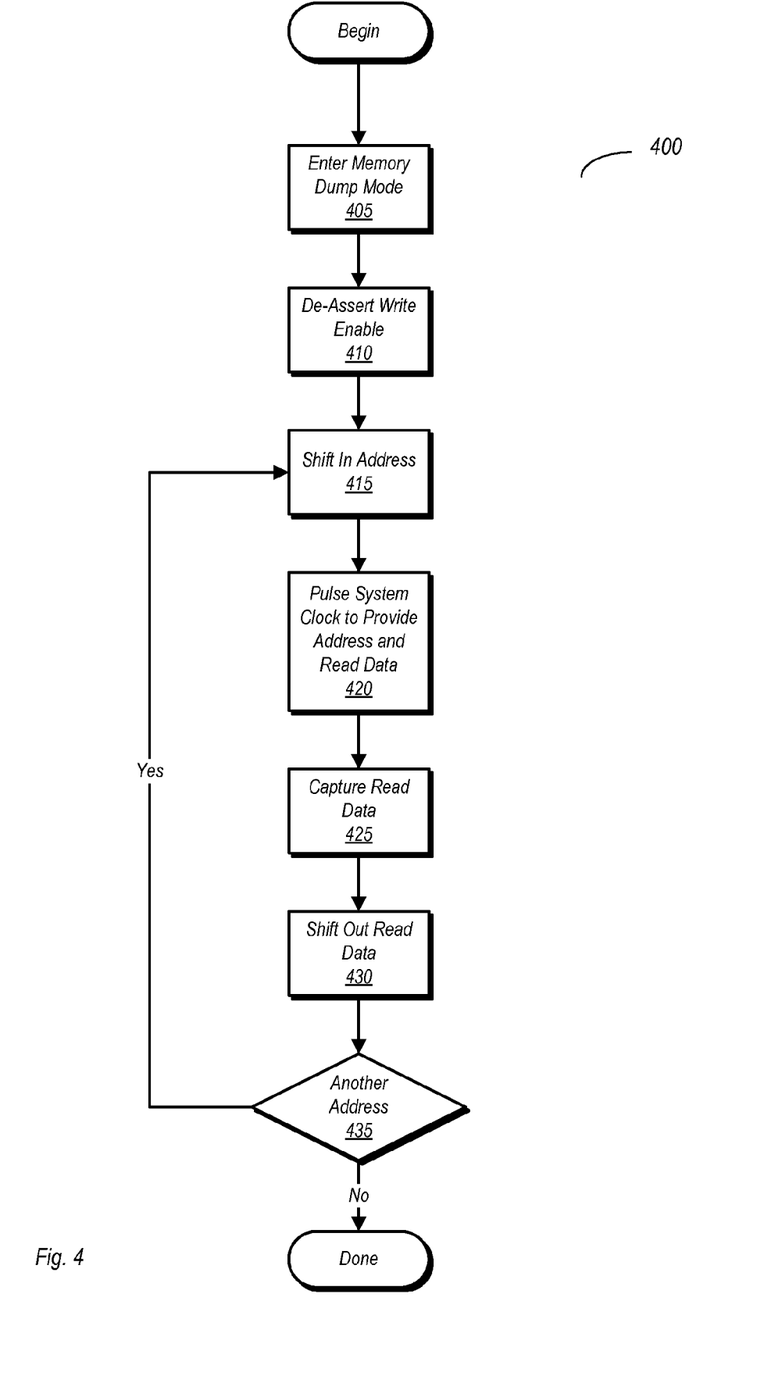
FIG. 4 is a flow diagram of one embodiment of a method for performing a dump operation without overwriting memory contents.

Method Flow Diagrams:

FIG. 4 is a flow diagram of one embodiment of a method for performing a dump operation without overwriting memory contents. In this case, method 400 is directed to performing a memory dump in an IC including a memory. It is noted however that the protection of current memory contents may also be performed during other operations, including the performance of a scan dump.

Method 400 begins with the entry into a memory dump mode (block 405). Responsive to entry into the memory dump mode, a write enable signal provided to the memory may be forced into a de-asserted state (block 410). Subsequent to the de-assertion of the write enable signal, shift operations may commence by shifting a memory address into the IC via serially coupled scan elements of a scan chain (block 415). The address may be shifted to scan elements that are coupled to provide an address to the memory (either directly or via additional address logic).

Once the address has been shifted to the appropriate scan elements and place onto the address inputs of the memory, a system clock may be pulsed to provide the address into the memory to perform a read operation (block 420). Data may be read from the memory at the provided address and placed onto a data output path. Subsequently, the data read from the memory may be captured by scan elements coupled to an output data path (e.g., a read port) of the memory (block 425). Shift operations may then resume to shift the captured data out (block 430).

If data is to be read from additional memory addresses (block 435, yes), then another address may be shifted in (block 415), with the process described above being repeated. In practice, for very long scan chains, a number of addresses forming a sequence of addresses to be read may be present within the scan chain at a given time. Each of these addresses may be shifted to scan elements where they are subsequently input into the memory for a read operation. The data stored at that address may be captured into the scan elements on the output data path. After the capture of data from a given address, the next address may be shifted in and the cycle can repeat again, and may continue to repeat for each of the memory addresses from which data is to be read. If no more memory addresses are to be read (block 435, no), then method 400 is complete.

Figure 5:
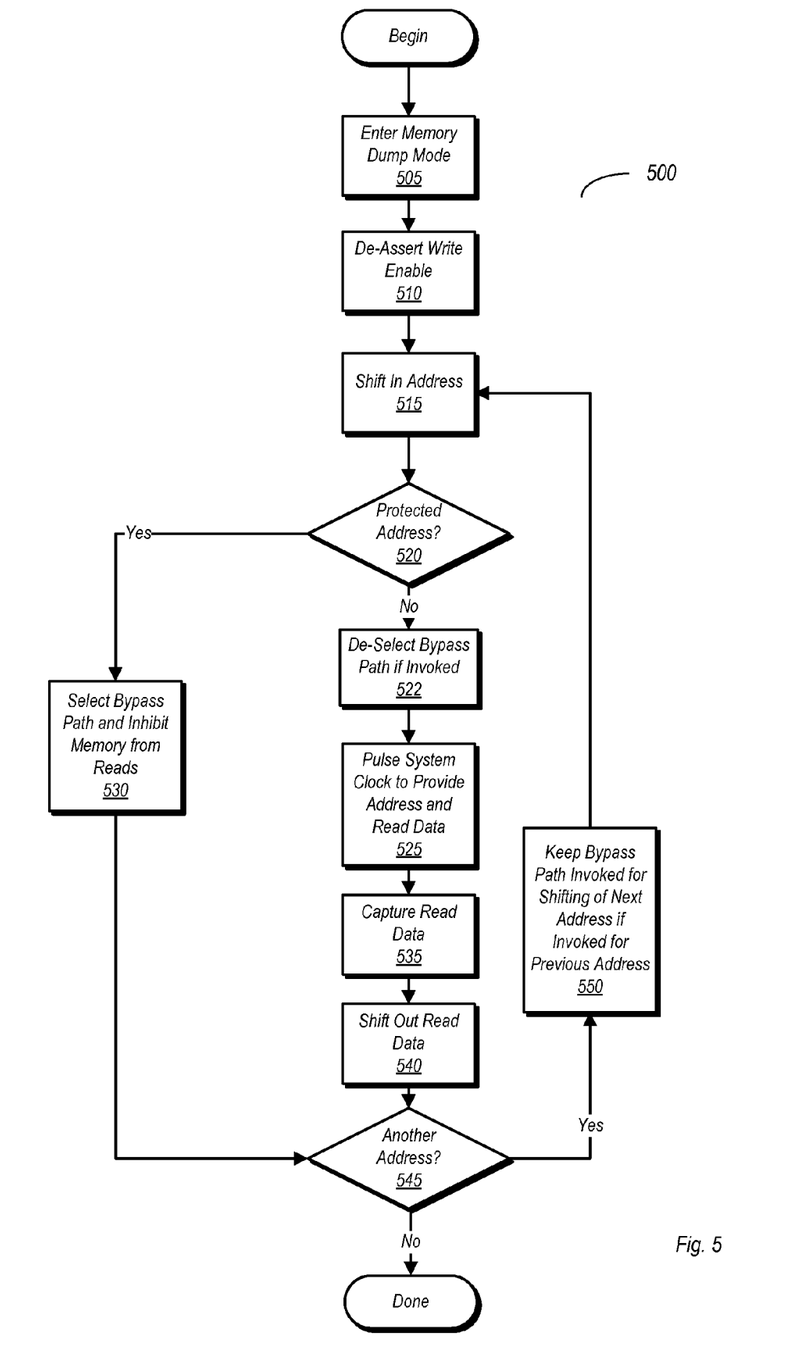
FIG. 5 is a flow diagram of one embodiment of a method for bypassing certain memory addresses during a memory dump operation.

FIG. 5 is a flow diagram of one embodiment of a method for bypassing certain memory addresses during a memory dump operation. In the embodiment shown, method 500 begins with the entry into a memory dump mode (block 505). Responsive to entry in the memory dump mode, a write enable signal provided to the memory is forced to a de-asserted state (block 510). De-assertion of the write enable signal may prevent inadvertent writes to the memory during scan shifting operations.

Subsequent to de-assertion of the write enable signal, scan shifting operations may commence by serially shifting one or more addresses into the scan chain (block 515). After a first address has reached the scan elements associated with the address inputs, a check may be performed to determine if the address is a protected address (block 530). If the address is a protected address, e.g., it is designated to store information to be protected from unauthorized access, then a bypass path is invoked (block 530). Invoking the bypass path effectively removes the scan elements coupled to a read port (e.g., output data path) of the memory from the scan chain. When the bypass path is invoked, data is not shifted through the scan elements coupled to the read port, but instead is shifted around these elements, e.g., via a selection circuit such as bypass circuit 13 of FIGS. 1 and 2. Thus, any data stored in a protected address remains inaccessible to the external pins of the IC.

If data from additional addresses is to be accessed during the memory dump (block 545, yes), then the bypass path may remain invoked if it was invoked for the address immediately previous (block 550). The next address may be shifted to the scan elements associated with the address input (block 515), while data is shifted around those scan elements associated with the read port.

If the next received address is not a protected address (block 520, no), then the bypass bath may be de-selected (block 522) to enable the scan elements associated with the read port to shift out captured data. Method 500 may flow similarly to method 400 of FIG. 4. More particularly, a system clock may be pulsed to provide the address and cause a read of data (block 525), the read data may be captured (block 535) and subsequently shifted from the scan elements coupled to the read port (block 540). If yet another address is to be read, that address may be shifted in per block 515, and the bypass path may remain de-selected, since the previously read address was not a protected address. This method may be repeated until all unprotected memory addresses have been read. Accordingly, a full state of the unprotected portion of the memory may be accessed for further analysis, while preventing unauthorized access to protected data.

Figure 6:
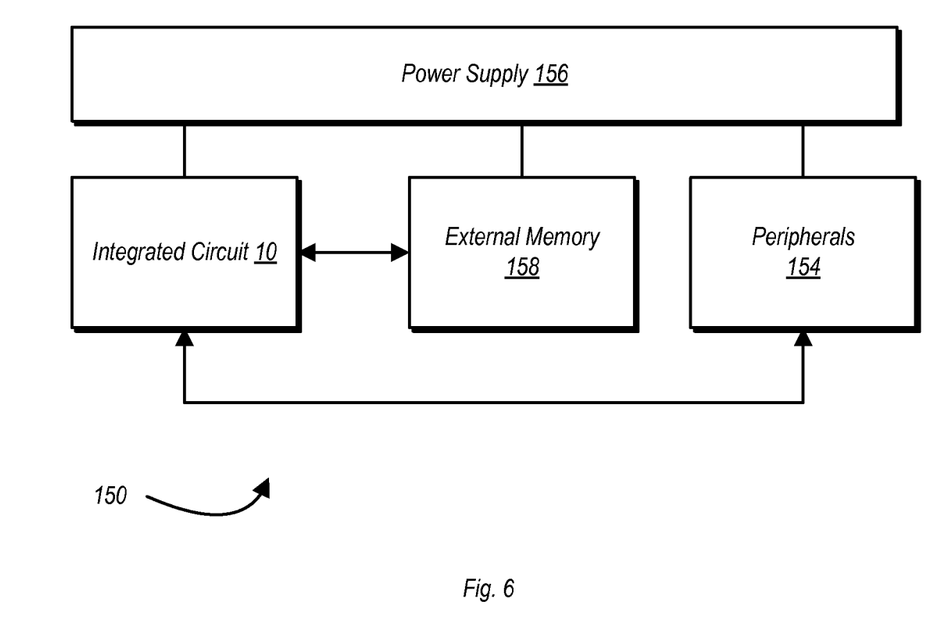
FIG. 6 is a block diagram of one embodiment of a system.

Exemplary System:

Turning next to FIG. 6, a block diagram of one embodiment of a system 150 is shown. In the illustrated embodiment, the system 150 includes at least one instance of an IC 10 (e.g., from FIG. 1) coupled to one or more peripherals 154 and an external memory 158. A power supply 156 is also provided which supplies the supply voltages to the IC 10 as well as one or more supply voltages to the memory 158 and/or the peripherals 154. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   a memory;
   a scan chain having a plurality of serially coupled scan elements, wherein a first subset of the plurality of serially coupled scan elements is coupled to input logic circuitry configured to provide inputs into the memory, and wherein each of a second subset of the plurality of serially coupled scan elements is coupled to receive data read from the memory via a data output path;
   an inhibit circuit, wherein the inhibit circuit is configured to inhibit data from being written to the memory via the first subset of scan elements when operating in either one of a scan dump mode and a memory dump mode; and
   a bypass circuit configured to, when enabled, cause the scan elements of the second subset to be bypassed when shifting data through the scan chain.

2. The integrated circuit as recited in claim 1, wherein the inhibit circuit is configured to cause a write enable signal to be de-asserted when shifting data through the scan chain in the scan dump mode and the memory dump mode.

3. The integrated circuit as recited in claim 1, wherein the inhibit circuit is configured to cause a memory enable signal to be de-asserted when shifting data through the scan chain in the scan dump mode and the memory dump mode.

4. The integrated circuit as recited in claim 1, wherein the bypass circuit is configured to cause scan elements of the second subset to be bypassed responsive to an attempt to read a protected address.

5. The integrated circuit as recited in claim 1, wherein the inhibit circuit is further configured to enable data to be written to the memory when operating in a normal scan test mode.

6. A method comprising:
   operating an integrated circuit in a normal mode;
   halting operation of the integrated circuit responsive to a trigger event;
   activating an inhibit circuit;
   performing a dump operation, wherein the dump operation comprises one or more of a plurality of serially coupled scan elements capturing data, the plurality of serially coupled scan elements forming a scan chain; and
   shifting captured data through the plurality of serially coupled scan elements, wherein the inhibit circuit is configured to prevent contents of a memory of the integrated circuit from being overwritten during said shifting;
   wherein the method further comprises operating in a bypass mode, wherein operating in the bypass mode comprises forming a bypass path around a subset of the plurality of serially coupled scan elements coupled to a data output path of the memory such that data is not shifted through the scan elements subset during scan shifting operations.

7. The method as recited in claim 6, wherein the dump operation comprises a scan dump operation, wherein performing the scan dump operation comprises:
   one or more of the plurality of serially coupled scan elements capturing data from one or more internal circuits of the integrated circuit; and
   shifting the captured data through the scan chain to scan data output of the integrated circuit.

8. The method as recited in claim 6, wherein the dump operation comprises a memory dump operation, wherein performing the memory dump operation comprises:
   a subset of the plurality of serially coupled scan elements capturing data from a first memory address, wherein the subset of the plurality of serially coupled scan elements is coupled to a data output path of the memory;
   shifting the captured data from the first memory address by a number of scan elements equal to a width of the data output path; and
   repeating said capturing and said shifting for one or more additional memory addresses.

9. The method as recited in claim 6, further comprising operating in the bypass mode responsive to an attempt to read from a protected address of the memory.

10. The method as recited in claim 9, further comprising entering the bypass mode responsive to a pre-selected address being provided to the memory during a memory dump operation, wherein the pre-selected address is designated for storing secure information.

11. An apparatus comprising:
    a scan chain having a plurality of serially coupled storage elements;
    a memory, wherein a first subset of the serially coupled storage elements is coupled to provide input signals to the memory, wherein a second subset of the serially coupled storage elements are coupled to a memory output path, and wherein the second subset of the serially coupled storage elements is configured to capture data output from the memory;
    a memory protection circuit, wherein the memory protection circuit is configured to, when the apparatus is operating in a dump mode, prevent writes to the memory when shifting data through the scan chain;
    a bypass unit configured to, when enabled, form a bypass path that excludes the second subset of the serially coupled storage elements responsive to the memory protection circuit indicating that a corresponding memory address is a protected memory address.

12. The apparatus as recited in claim 11, wherein the memory protection circuit is configured to cause a de-assertion of a memory enable signal responsive to entering the dump mode.

13. The apparatus as recited in claim 11, wherein the memory protection circuit is configured to cause a de-assertion of a write enable signal responsive to entering the dump mode.

14. A method comprising:
    operating an integrated circuit in a scan test mode, wherein operating in the scan test mode includes a memory protection unit enabling writes to a memory during shifting of data through a scan chain;
    operating the integrated circuit in a dump mode, wherein operating in the dump mode includes the memory protection unit inhibiting writes to the memory during shifting data through the scan chain; and
    operating in a bypass mode, wherein operating in the bypass mode comprises shifting data through scan elements of the scan chain and further comprise bypassing selected scan elements of the scan chain, wherein the selected scan elements of the scan chain are coupled to a data output path of the memory.

15. The method as recited in claim 14, wherein the dump mode is a memory dump mode, and wherein operating in the memory dump mode includes the selected scan elements of the scan chain receiving data from the data output path of the memory.

16. The method as recited in claim 15, further comprising operating in the bypass mode responsive to a bypass unit receiving an indication of a read of a protected memory address.

17. The method as recited in claim 15, further comprising the selected scan elements receiving data from each of a plurality of memory address during each of a corresponding plurality of memory reads.

18. The method as recited in claim 14, further comprising the memory protection unit de-asserting a write enable signal received by the memory responsive to entering the dump mode.

19. An integrated circuit comprising:
   a memory;
   a scan chain having a plurality of serially coupled scan elements, the plurality of serially coupled scan elements including:
      a first subset of scan elements coupled to input logic, wherein the input logic is coupled to provide input signals to the memory; and
      a second subset of scan elements coupled to receive data from a data output path of the memory;
   a memory protection unit configured to prevent writes to the memory during scan shifting operations commensurate with a memory dump mode; and
   a bypass circuit configured to, when enabled, cause the second subset of scan elements to be bypassed during scan shifting operations responsive to an attempt to read data from a protected address of the memory.

20. The integrated circuit as recited in claim 19, further comprising a control unit configured to provide a first indication of operation in the memory dump mode to the memory protection unit.

21. The integrated circuit as recited in claim 20, wherein the control unit is configured to provide a second indication to the memory protection unit when operating in a scan test mode.

22. The integrated circuit as recited in claim 20, wherein the memory protection unit is configured to cause a de-assertion of a write enable signal responsive to receiving the first indication, wherein the memory is configured to enable writes thereto when the write enable signal is asserted.

23. The integrated circuit as recited in claim 20, wherein the memory protection unit is further configured to de-assert a memory enable signal, wherein the memory is configured to enable reads therefrom when the memory enable signal is asserted.

\* \* \* \* \*